United States Patent [19]

Kosa et al.

[11] Patent Number: 4,926,222
[45] Date of Patent: May 15, 1990

[54] SEMICONDUCTOR MEMORY DEVICE AND A METHOD OF MANUFACTURING THE SAME

[75] Inventors: Yasunobu Kosa, Kodaira; Shinji Shimizu, Koganei, both of Japan

[73] Assignee: Hitachi, Ltd., Tokyo, Japan

[21] Appl. No.: 545,767

[22] Filed: Oct. 26, 1983

Related U.S. Application Data

[60] Division of Ser. No. 241,539, Mar. 9, 1981, Continuation of Ser. No. 891,030, Mar. 28, 1978, abandoned.

[30] Foreign Application Priority Data

Apr. 6, 1977 [JP] Japan .................................. 52-38528

[51] Int. Cl.$^5$ .......................................... H01L 29/78
[52] U.S. Cl. .................... 357/23.5; 357/23.9; 357/23.11; 357/23.14; 357/49; 357/52; 357/54; 357/55; 357/59; 357/71
[58] Field of Search ................... 357/23.5, 23.9, 23.11, 357/23.14, 49, 52, 54, 55, 59, 71

[56] References Cited

U.S. PATENT DOCUMENTS

| | | | |
|---|---|---|---|
| 3,899,373 | 8/1975 | Antipov | 357/23 |
| 4,112,509 | 9/1978 | Wass | 357/23 |
| 4,122,544 | 10/1978 | McElroy | 357/23 |
| 4,272,774 | 6/1981 | Boettcher | 357/23.5 |

*Primary Examiner*—Edward J. Wojciechowicz
*Attorney, Agent, or Firm*—Antonelli, Terry, Stout & Kraus

[57] ABSTRACT

A semiconductor memory device and a method of manufacturing the device wherein a field insulation is formed in a surface of a semiconductor body except for the source, drain and channel regions, a first floating gate is self-aligned to the channel region, a second gate insulated from the first floating gate covers the first floating gate and the first insulator having a width substantially same as the length of the channel region between the source and the drain regions.

40 Claims, 7 Drawing Sheets

FIG. 34

SEMICONDUCTOR MEMORY DEVICE AND A METHOD OF MANUFACTURING THE SAME

This is a Division of application Ser. No. 241,539, filed March 9, 1981, which is a continuation of application Ser. No. 891,030, filed March 28, 1978, now abandoned.

LIST OF PRIOR ART (37CFR 1.56(a))

The following references are cited to show the state of the prior art:

(1) J. Barnes et al., "Operation and Characterization of N-channel EPROM cells", Technical Digest 1976 International Electron Device Meeting, December 6, 7 and 8, 1976, pp. 173 to 176.

(2) V. L. Rideout et al. "MOSFETs with Polysilicon Gates Self-aligned to the Field Isolation and to the Source/Drain Regions", Technical Digest 1976 International Electron Devices Meeting, December 6, 7, and 8, 1976, pp. 593 to 596.

(3) Frohman-Bentchkowsky, U.S. Pat. No. 3,660,819, May 1972.

(4) Dawson Kahng, U.S. Pat. No. 3,500,142, Mar. 1970.

BACKGROUND OF THE INVENTION

The present invention relates to an insulated gate type field effect transistor and, more particularly, to a non-volatile semiconductive memory device having a floating polysilicon layer, as well as to a method of manufacturing the device.

In the past, various types of electrically programable read only memory device making use of MOS (metal oxide semiconductor) elements have been proposed.

Among these proposed read only memory devices, a device called EPROM (Electrically Programmable Read Only Memory) of nMOS type, manufactured by a double polysilicon layer technique and having a floating type first (underlying) polysilicon layer acting as an electric-charge accumulation layer, is most popular.

As a result of current demand for increased numbers of circuits elements integrated on a single semiconductive substrate, it is becoming a matter of significance to make each memory cell, which constitutes the unit of memory function in semiconductive chips having the ROM of the kind described, as small as possible.

At the same time, it is to be pointed out that the process for manufacturing these semiconductive devices is inevitably rendered complicated, as the density of the integration is increased.

BRIEF SUMMARY OF THE INVENTION

It is therefore an object of the invention to provide an improved insulated gate type field effect transistor.

It is another object of the invention to provide an electrically programmable read only memory of reduced size of cells.

It is still another object of the invention to provide a simple construction of double polysilicon layer type electrically programmable read only memory having a good reproducibility.

It is a further object of the invention to provide an improved technique suitable for manufacturing electrically programmable read only memories of increased density of integration.

It is still another object of the invention to provide a method of manufacturing memory cells of electrically programmable read only memory, consisting of a simplified manufacturing process.

To these ends, according to the invention, there is provided a semiconductor device having a substrate including a source and a drain region, a first floating gate formed on said substrate through a first insulating film, a second control gate formed on the first floating gate through a second insulating film, and a field insulator formed on the field region of the substrate, wherein the floating gate and the control gate do not substantially overlap the source and drain regions, and the floating gate does not overlap the field insulator formed on the field region.

These and other objects, as well as advantageous features of the invention will become clear from the following description of the preferred embodiments taken in conjunction with the accompanying drawings.

DESCRIPTION OF THE PREFERRED EMBODIMENTS

Before turning to the description of the preferred embodiments, an explanation will be made as to the theoretical construction of floating type memory cell, with specific reference to FIGS. 1 to 3.

Figure 1:
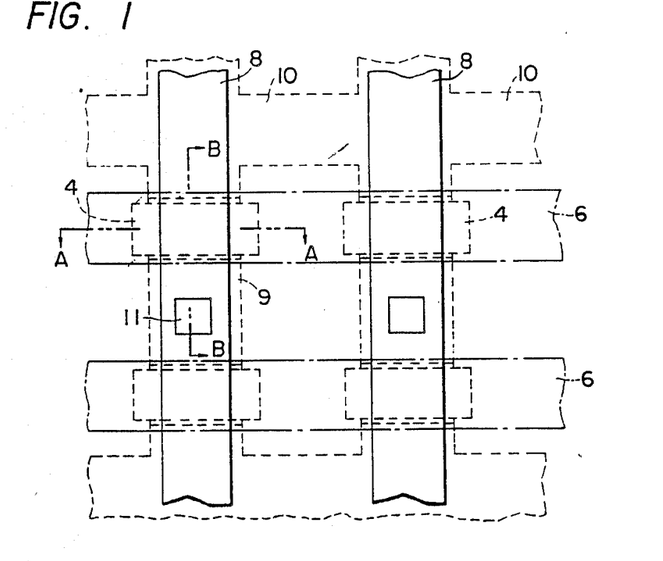
FIG. 1 is a plan view of a floating type memory cell, drafted for an easier understanding of the principle and basic construction of the same.
Figure 2:
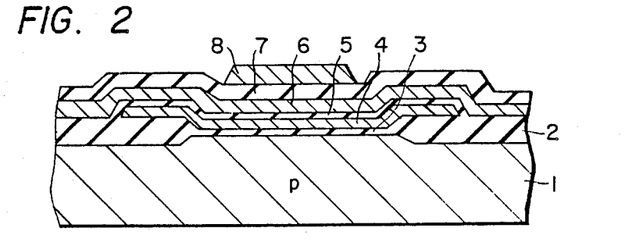
FIG. 2 is a sectional view taken along the line A—A of FIG. 1.

Referring first to FIG. 1 showing the plan of the memory cell and to FIG. 2 showing the section taken along the line A—A of FIG. 1, reference numeral 1 denotes a P type silicon substrate, while reference numeral 2 designates a field oxidized film obtained by a selective oxidation. Reference numerals 3, 4 and 5 denote, respectively, a first insulated gate film ($SiO_2$), first floating polysilicon film and a second insulated gate film. A second polysilicon film which constitutes a control gate, and an intermediate insulating layer such as PSG are designated at numerals 6 and 7, respectively. Reference numeral 8 denotes an aluminum wiring layer.

Figure 3:
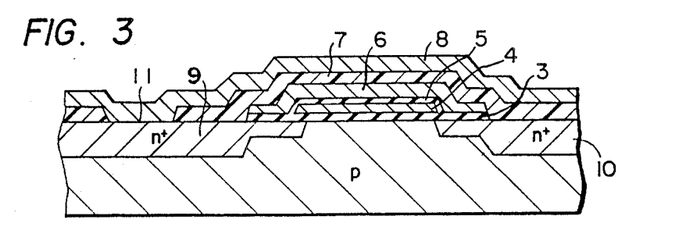
FIG. 3 is a sectional view taken along the line B—B of FIG. 1.

Referring now to FIG. 3 showing the section of the cell taken along the line B—B of FIG. 1, reference numerals 9 and 10 denotes $n^+$ type diffusion layers constituting a drain and a source region, respectively, while a contact area of the wiring layer is designated at numeral 11. In the above stated memory cell, the field oxidized film 2 is formed by a selective oxidation employing a mask of $Si_3N_4$ selectively covering the active region.

As will be seen from FIGS. 1 through 3, the first polysilicon layer 4, which is a floating gate, overlaps the field oxidized film 2, while the second polysilicon layer 6 overlaps the first polysilicon layer 4. These overlaps are formed by means of a photoresist mask which, for effecting these overlaps, has to have dimensional margin of 2 to 5 microns, inconveniently resulting in an enlarged size of the cell.

It is also to be pointed out that the FAMOS (Floating Avalanche MOS) memory cell of the kind described can be manufactured only through an extremely complicated manufacturing process.

More specifically, according to the most popular way of manufacturing, the first gate oxidized film 3 is formed on the active region of the Si substrate, after forming the field oxidized film 2 on a part of the surface of the substrate 1. Then, the first polysilicon film 4, which constitutes the floating gate is formed on the first gate oxidized film 3. Subsequently, the floating gate pattern is formed by means of a photoetching. Then, the Si substrate and the polysilicon layer are doped with impurities, by means of an ion driving or heat diffusion technique making use of a mask of polysilicon, so as to form the second gate oxidized film 5. Then, the second polysilicon layer is formed by CVD (Chemical Vapor Deposition) method. Subsequently, a photoetching is carried out with such a pattern that the first polysilicon layer is completely covered with the second polysilicon layer, and the doping with the impurities is carried out again.

As a result of above stated complicated process having a number of steps, the cost of manufacture of the memory cell is rendered considerably high.

Figure 4:
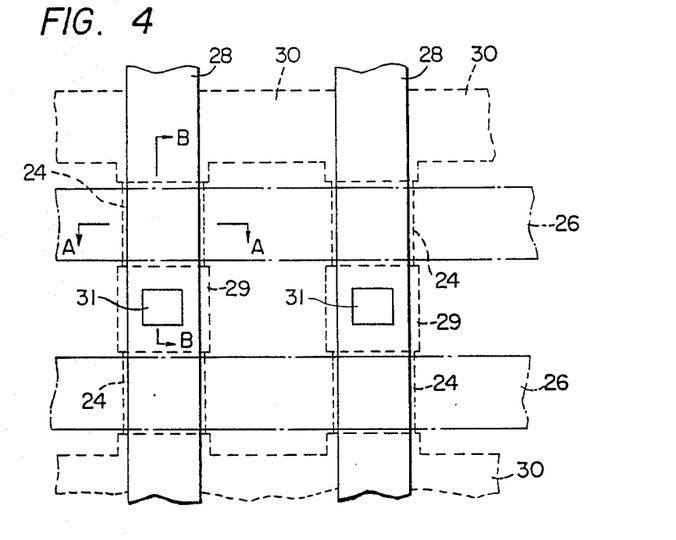
FIG. 4 is a plan view showing the basic construction of a floating memory section of a memory device in accordance with the invention.
Figure 5:
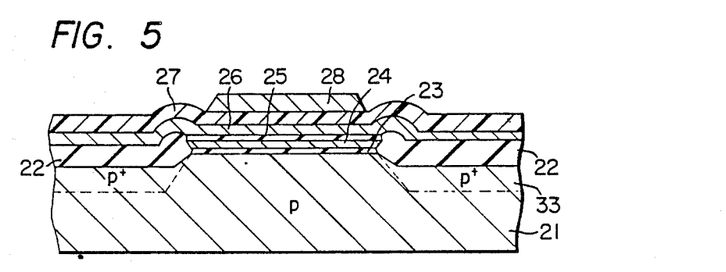
FIG. 5 is a sectional view taken along the line A—A of FIG. 4.
Figure 6:
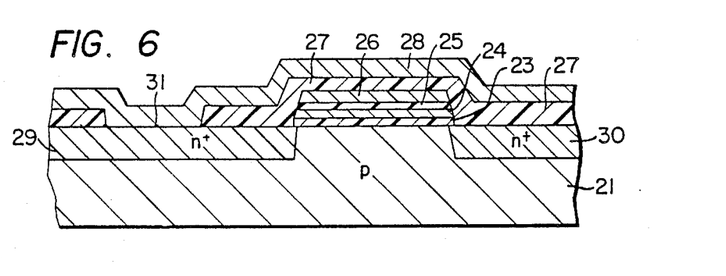
FIG. 6 is a sectional view taken along the line B—B of FIG. 4, FIGS. 7 to 10 are sectional views corresponding to that taken along the line A—A of FIG. 4, in respective steps of process in accordance with the invention for manufacturing the floating type memory cell.

Under these circumstances, the present inventors have succeeded in obtaining an improved construction of memory cell as shown in FIGS. 4 thru 6, making a positive use of self-aligning formation of the first polysilicon layer which constitutes the floating gate with the second polysilicon layer which constitutes the control gate and the wiring layer, as well as a self-aligning formation of the first polysilicon layer which constitutes the floating gate with the field $SiO_2$ film.

Hereinafter, a preferred embodiment of the invention will be described with specific reference to FIGS. 4 thru 6. As will be seen from these Figures, in the memory cell and the electrically programmable read only memory device of this embodiment, a plurality of insulated gate type field effect transistors, each having an N type source region 30 and a drain region 29, are formed on a P type semiconductor substrate 21, so as to form respective memory cells. The opposite side surfaces of a channel region between the source and the drain regions 30, 29 are terminated by a thick isolation 22 such as, for example, a field oxide film made of silicon oxide. At the same time, a metallic layer which constitutes the first floating gate electrode, such as a polysilicon layer 24 is formed only just above the channel area defined as above, with a thin gate insulating film 23 interposed therebetween, so as to have an area substantially equal to that of the channel region. Thus, the layer 24 is not extended to lie over the thick field oxide film 22.

A second metallic layer such as a polysilicon layer 26 is formed just above the first polysilicon layer 24 constituting the aforementioned floating gate, with an interlayer insulating film 25 such as a silicon nitride film interposed therebetween. The second polysilicon layer 26 is extended to lie partially over the field oxide film 22 located at a side of the channel area. This second polysilicon layer 26 also self-aligns with the channel area between the source and the drain regions 30,29, so as to extend just above the channel area transversely of the same.

A wiring layer 28 made of a metallic material such as aluminum is formed across the second polysilicon layer 26, with a second insulating film 27 such as of phosphosilicate-glass interposed therebetween, and is connected to the drain region 30 through a window 31 formed in the insulating film 27.

Thus, in the electrically programmable read only memory device of the invention, the first floating polysilicon gate 24 is disposed on the channel region sandwiched between the source and drain regions and having side surfaces terminated by relatively thick field oxide film, so as to have substantially the same dimension as the channel area. At the same time, a second polysilicon layer 26 is disposed to have a width substantially equal to the length of the channel area and to extend at a right angle to the channel just above and across the same. In other words, in the memory cell of the embodiment under description, the boundaries of the first floating gate electrode 24, the first inter-layer insulating film 25, the second gate electrode 26 and the source and drain regions defining the channel area are self-aligned to one another, while the field oxide film 22 is self-aligned to the first floating gate electrode 24 and to the source and drain regions.

In FIGS. 4 thru 6 inclusive, reference numeral 33 denotes a semiconductive region of the same conductivity type as the semiconductive substrate 21 and formed on the latter to lie under the thick field oxide film 22. This semiconductive region 33 is provided to prevent a generation of a parasitic channel on the surface of the substrate attributable to an application of voltage to the second polysilicon layer (control gate line) 26. At the same time, as will be seen also from these Figures, this semiconductive layer 33 is also formed just beneath the field oxide film 22 in self-alignment with the latter.

A so-called EPROM (electrically programmable read only memory) is constituted by a plurality of memory cells in accordance with the invention regularly arrayed in two orthogonal directions as a matrix. FIG. 4 shows a part of the electrically programmable read only memory in accordance with the invention. Only four memory cells are shown for clarifying the drawings.

As will be understood from the following detailed description of process for manufacturing the memory cell and the electrically programable read only memory in accordance with the invention, as well as from FIGS. 4 to 6 inclusive, the first polysilicon layer (floating gate) 24 does not overlap the thick field oxide film 22, because they are formed in self-alignment. At the same time, as will be most clearly seen from FIG. 6, the edges of the first polysilicon layer 24 and the second polysilicon layer 26 are formed through a photoetching by means of the same photomask, so that no margin of mask alignment is required. Consequently, the size of cells can conveniently be reduced by 40%, as compared with that as shown in FIGS. 1 to 3, provided that the working precisions are equal.

FIGS. 7 to 16 show major steps of a process for manufacturing a FAMOS memory in accordance with the invention. Although the following description is made exemplarily as to the manufacture of n-channel type FAMOS, it is to be noted that the invention is never restricted to the n-channel type memory.

More specifically, FIGS. 7 to 10 show the steps for obtaining the construction as shown in FIG. 5, in section taken along the line A—A, while FIGS. 11 to 16 show the steps for obtaining the construction as shown in FIG. 6, in section taken along the line B—B of FIG. 4.

Figure 7:
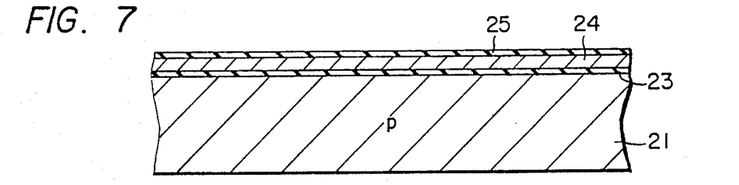
Figure 11:
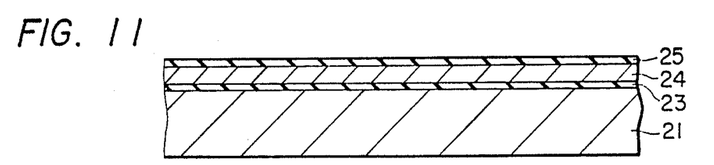
FIGS. 11 to 16 are sectional views corresponding to that taken along the line B—B of FIG. 4, in respective steps of process in accordance with the invention for manufacturing the floating type memory cell.

(1) At first, an Si monocrystal wafer (substrate) 21 of a specific resistance of 5 to 8 $\Omega$cm and having a (100) crystal surface of P conductive type is prepared. After suitably cleaning the wafer 21, the first gate oxide film ($SiO_2$) is formed to have a thickness of, for example, 1000 Å, as shown in FIGS. 7 and 11. This can be performed by, for example, heat-treating the wafer 21 at a temperature of 1000° C. for 165 minutes, in the atmosphere of dry $O_2$. Immediately after the formation of this film 23, the first polysilicon film 24, which constitutes the floating gate, is formed on the oxide film 23.

In conventional Si gate process, the polysilicon layer functions not only as the gate electrode but as the wiring layer as well. Therefore, it has been necessary to make the polysilicon layer have a relatively large thickness of 0.3 to 0.6 microns, and to effect the doping with impurities at a high concentration, so as to reduce the surface specific resistance as much as possible.

However, in the FAMOS memory in accordance with the invention, the floating gate is intended for spreading and holding the injected charges, so that the lowered specific surface resistance is not always essential. Thus, the thickness of the first polysilicon layer 24 may be as small as 0.1 to 0.4 micron, preferably 0.1 to 0.2 micron. At the same time, the doping with the impurities may not be performed at a high concentration, and such a low surface specific resistance as 100 $\Omega$ to 100 K$\Omega$/cm$^2$ as could be obtained by a simple doped poly Si method is sufficient. Alternatively, the doping in this step can completely be omitted from this step of process, because a sufficient amount of impurities are doped to ensure the required memory characteristic of FAMOS, during the later-performed diffusion step for forming the source/drain and second gate, due to a side diffusion.

After the formation of the first polysilicon layer 24, an $Si_3N_4$ film 25, which functions as the mask for the selective oxidation and as the insulating inter-layer between the first and the second polysilicon layers, is formed to have a thickness of 0.07 to 2.20 micron, preferably 0.10 to 0.15 micron.

Figure 8:
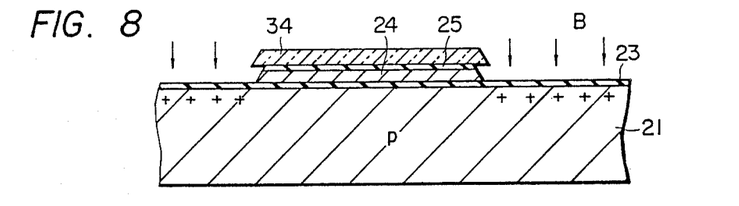
Figure 12:
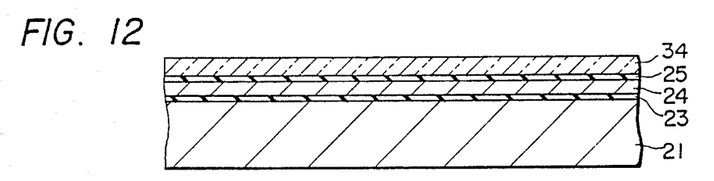

(2) Subsequently, the active region consisting of the channel, source and drain regions is covered with a photoresist film 34, as shown in FIGS. 8 and 12, and the portions of the $Si_3N_4$ film and of the first polysilicon layer 24 are removed through a plasma etching making use of, for example, $CF_4+O_2$. Then, for the purpose of enhancing the threshold of the field $SiO_2$ section, Boron ions are driven through the oxide film 23 exposed in the surface of the substrate, at a rate of, for example, $5 \times 10^{13}$ cm$^{-2}$ at 75 KeV. The photoresist film 34 is suitably removed after the ion driving.

Figure 9:
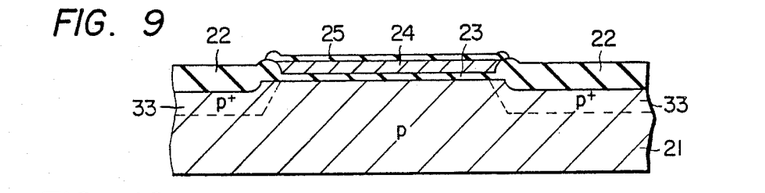
Figure 13:
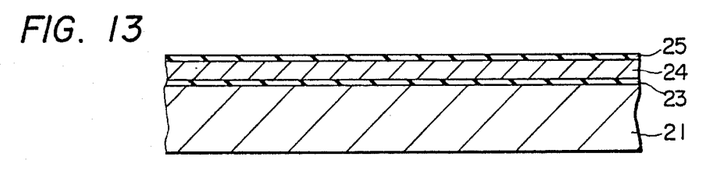

(3) Then, as shown in FIG. 9 and FIG. 13, a field $SiO_2$ film 22 of a thickness of 1.0 to 1.5 micron is formed on the portion of the substrate surface where the $Si_3N_4$ film 25 and the first polysilicon layer 24 have been removed, by a heat oxidation method making use of the $Si_3N_4$ film as a mask. This can be performed by heat treating the substrate in the atmosphere of wet $O_2$ or steam for 6 to 18 hours. During this heat treating, the $Si_3N_4$ film is oxidized to the depth of 200 to 500 Å. However, this depth is negligibly small as compared with the whole thickness of the field $SiO_2$ film 22 and, therefore, has been neglected from the drawings, for the clarification of the latter. As a result of the above stated heat treatment, the boron ions driven into the region under the $SiO_2$ film 22 are diffused through the Si substrate to form a P$^+$ diffusion layer 33.

Figure 10:
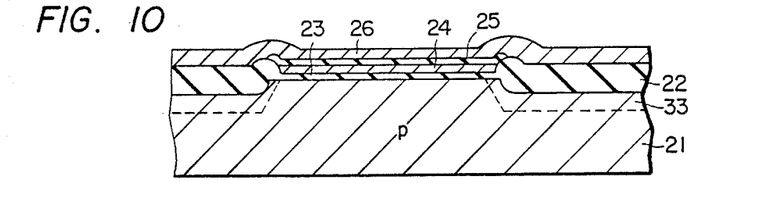
Figure 14:
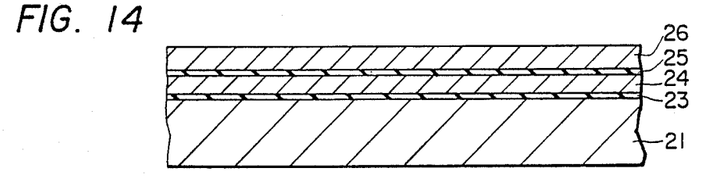

(4) As a subsequent step, as shown in FIGS. 10 and 14, the second polysilicon layer 26 is deposited over the entire surface, without removing the $Si_3N_4$ film 25 on the first polysilicon layer 24 and the $SiO_2$ film (not shown) on the $Si_3N_4$ film 25.

Figure 15:
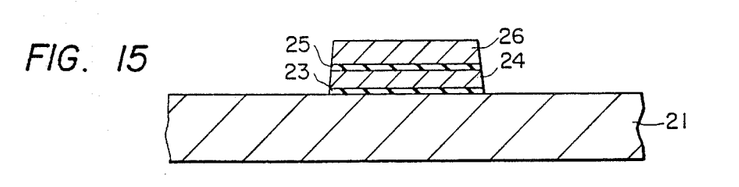

(5) Then, the control gate and the polysilicon wiring layer are formed by a photoetching. As will be seen from FIG. 15, the etching is effected on the second polysilicon layer 26, insulating interlayer 25, first polysilicon layer 24 and the first insulating layer 23, by means of the same mask. Since three or four layers are photoetched by the same mask, the control gate 26 and the floating gate 24 are formed in self-alignment, as shown in FIG. 15.

Figure 16:
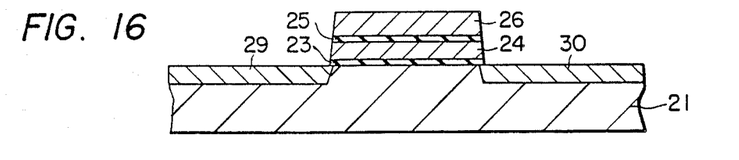

(6) After the completion of the photoetching, the exposed substrate surface and the polysilicon layer 26 are doped with impurities of the opposite conductive type to the substrate, e.g. phosphorus (P) and arsenic (As), by means of, for example, a heat diffusion method. As a result of this doping, N-type source region 30 and drain region 29 are formed as shown in FIG. 16.

(7) Subsequent steps are same as those of the conventional process for manufacturing the Si gate MOSIC. Namely, a PSG (phosphorus silicate glass) film 27, which constitutes an insulation layer between the Al wiring 28 and the polysilicon layer 26, is formed by CVD (chemical vapor deposition) method, as shown in FIGS. 5 and 6. Then, a photoetching is effected to form the contact window 31. Finally, the Al wiring 28 is formed by means of Al evaporation film.

The aforementioned objects of the invention can be achieved by the above described embodiment, as will be understood from the following description.

(1) The first polysilicon layer 24 which constitutes the floating gate and the field $SiO_2$ film 22 are formed in self-alignment, because the field $SiO_2$ film 22 is formed making the $Si_3N_4$ film on the first polysilicon layer 24 as the mask.

(2) The first and the second polysilicon layers 24,26 are formed in complete self-alignment, because the first layer 24, the insulating-interlayer 25 and the second layer 26 of the memory cell section are formed by a simultaneous etching.

(3) The constituents of the memory section are completely self-aligned by a relatively simple process, so as to provide a construction of minimized size.

(4) A relatively thick field oxide film is formed on the surface of the semiconductive substrate surface, making use of the silicon nitride film as a mask. Consequently, the multi-layered wiring in the memory cell section is rather flattened.

In the foregoing embodiment, the insulating interlayer 25 between the first polysilicon layer 24 and the second polysilicon layer 26 is constituted by the silicon nitride film. However, in order to minimize the strain caused in the first polysilicon layer by the difference of coefficients of thermal expansion, the first step (1) of the foregoing embodiment is preferably modified such that the $Si_3N_4$ film 25 is formed on an extremely thin heat-oxidized film ($SiO_2$) film of a thickness of 0.01 to 0.1 micron, after forming the extremely thin film on the surface of the first polysilicon layer 24.

Figure 17:
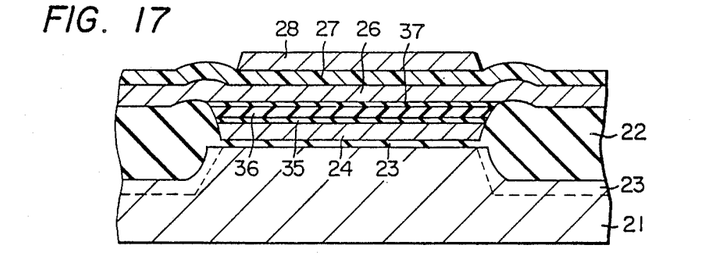
FIGS. 17 and 18 are sectional views of essential parts of different embodiments in accordance with the invention.
Figure 18:
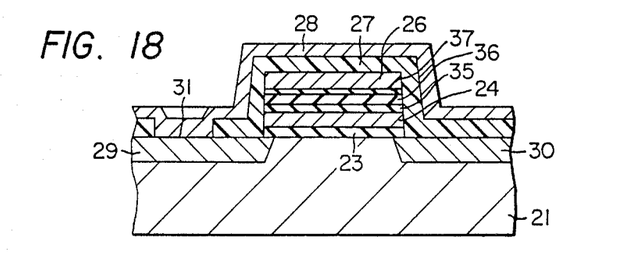

As stated before in relation with the step (3) of the process of the embodiment, a thin silicon oxide film of thickness of 200 to 500 Å is formed on the surface of the $Si_3N_4$ film, during the selective oxidation of the substrate employing the mask of $Si_3N_4$. This silicon oxide film may be positively utilized to form a memory cell construction as shown in FIGS. 17 and 18. FIGS. 17 and 18 correspond, respectively, to the sectional views as shown in FIGS. 5 and 6. In these Figures, reference numerals 35 and 37 denote, respectively, the silicon oxide film of 100 to 1000 Å and the silicon oxide film of 200 to 500 Å. The silicon nitride film sandwiched by these silicon oxide films is denoted by reference numeral 36. By adopting this construction to avoid the direct contact of the silicon nitride film with the gate electrode, i.e. when the silicon nitride film is formed through a medium of the silicon oxide film, it is conveniently avoided that the carrier charged to the gate electrode in accordance with the wiring operation is trapped by the silicon nitride film, so that the lowering of the potential of the gate electrode can be diminished. Namely, the above mentioned two silicon oxide films function as stoppers against the trapping of the carrier, so as to provide a desirable electric characteristics in memory devices such as the non-volatile semiconductive memory in accordance with the invention.

At the same time, instead of forming the insulating interlayer 25 of silicon nitride film, the step (4) of the process of the foregoing embodiment may be modified such that the $Si_3N_4$ film and the $SiO_2$ film on the first polysilicon film 24 are removed and a heat oxidized ($SiO_2$) film of 1000 to 2000 Å is formed instead. The second polysilicon layer 26 is formed on this newly formed $SiO_2$ film. However, in this case, the thickness of the $SiO_2$ film must be as small as possible, because the electrostatic capacitance between two gate electrodes is made small due to the dielectric constant of $SiO_2$ smaller than that of $Si_3N_4$.

The so-called memory cell matrix or mat as shown in FIG. 4 having a number of memory cells arrayed in columns and rows is produced by the above described process.

Figure 19:
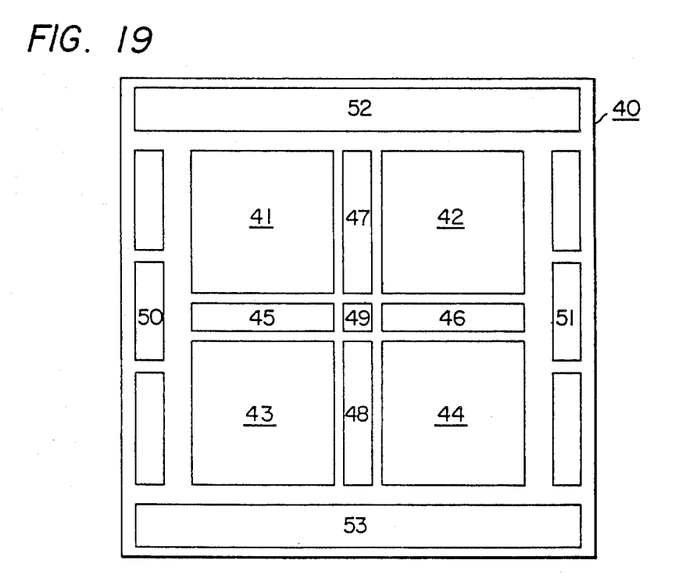
FIG. 19 is a schematic illustration of planar pattern of a semiconductor chip for an electrically programmable read only memory device in accordance with the invention.

In practically mounting an electrically programmable read only memory on a single silicon semiconductor chip, as shown, for example, in FIG. 19 schematically illustrating the pattern on the chip, the aforementioned memory cell mats 41, 42, 43, 44 are mounted on the semiconductor chip 40. At the same time, peripheral circuits electrically connected to these mats, e.g. sense-amp. circuit sections 45, 46; X decoder circuit sections 47, 48; Y decoder circuit section 49; input buffer circuit sections 50, 51; input/output circuit sections 52, 53 and so forth are arranged around these memory cell mats.

These peripheral circuits are constituted by insulating gate type semiconductor elements, similarly to the formation of the memory mats. Thus, according to the invention, these peripheral circuits can conveniently be mounted on the same semiconductor substrate as the memory mats, simultaneously with the formation of the latter, by making use of the above described process without substantially changing the same.

Figure 20:
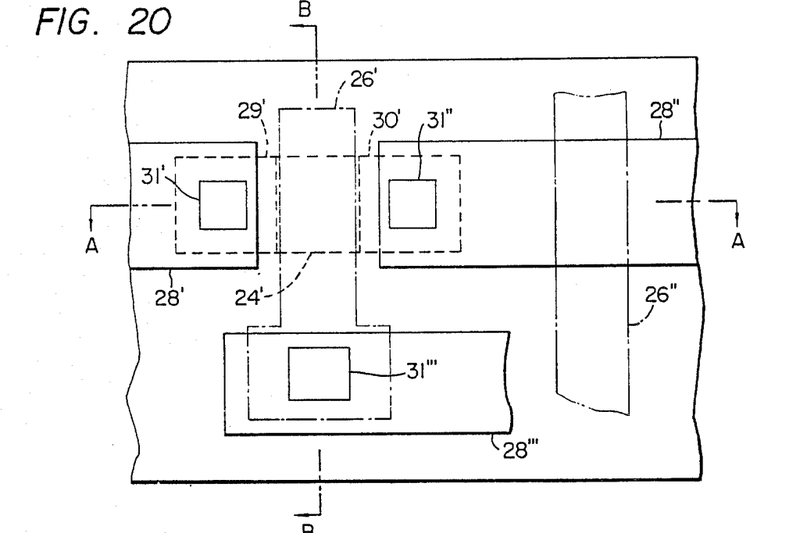
FIG. 20 is a plan view of a metal-oxide semiconductor field effect transistor which constitutes the peripheral circuit portion other than the memory cell mats, formed in the chip as shown in FIG. 19.
Figure 21:
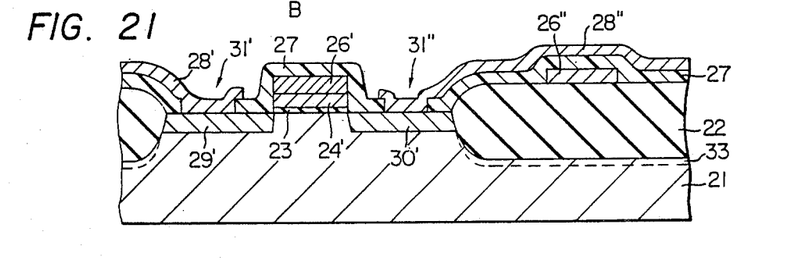
FIG. 21 is a sectional view taken along the line A—A of FIG. 20.
Figure 22:
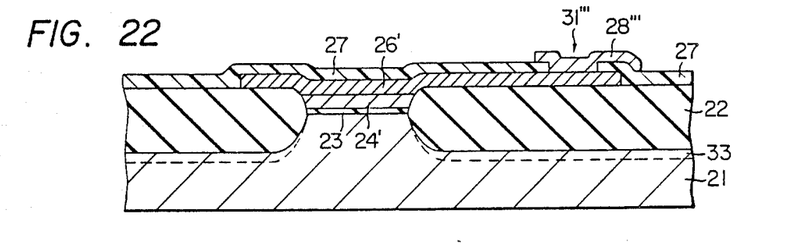
FIG. 22 is a sectional view taken along the line B—B of FIG. 20, and FIGS. 23 to 28 and FIGS. 29 to 34 are sectional views of elements corresponding to those of FIG. 21 and FIG. 22, in respective steps of process for manufacturing the element.
Figure 23:
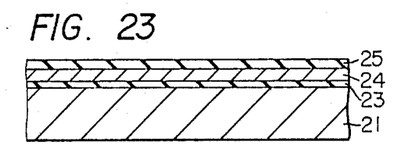
Figure 24:
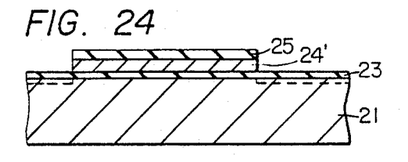
Figure 25:
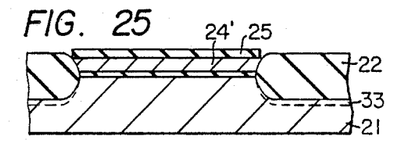
Figure 26:
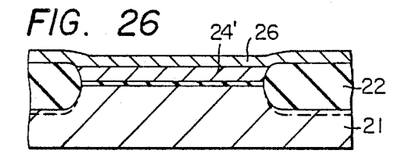

By way of example, a reference is made here to FIG. 20 which shows a plan view of a typical insulated gate type field effect transistor constituting the above stated peripheral circuits, as well as to FIGS. 21 and 22 showing sections taken along the line A—A and line B—B of FIG. 20, respectively. In these Figures, the members and parts similar to those of the foregoing embodiment are denoted by the same reference numerals for an easier understanding.

In this regard, each of 31', 31" and 31''' are contact windows, in PSG film 27, for connections to drain and source regions 29' and 30', and to second polysilicon layer 26', respectively; 28''' is a wiring layer for connecting through window 31''' to second polysilicon layer 26'.

As will be seen from these Figures, as well as from the later-mentioned detailed illustration of process, the first gate electrode of a MOS transistor constituting a part of the peripheral circuits other than the memory mats is inconveniently formed in a floating state, if the MOS transistor is formed in the same process as the memory cells. Therefore, in order to ensure the direct contact of the second polysilicon layer 26 with the first polysilicon layer 24, the desired portion of the insulating interlayer 25 has been selectively removed immediately before the formation of the second polysilicon layer 26. The polysilicon layer 26" found on the thick field oxide layer 22 in FIGS. 20 and 21 is formed during the formation of the second polysilicon layer 26, and can be made use of as a wiring layer, constituting a so-called cross wiring which is separated from other Al wiring layers 28".

Sections taken along the lines A—A and B—B of FIG. 20 are shown by FIGS. 23 to 28 and FIGS. 29 to 34, respectively, in each step of the manufacturing process. These steps are not detailed here, because they are obviously understood from the description of the foregoing embodiment taken in relation with FIGS. 4 thru 16, except for the following characteristic features.

Namely, as will be seen from FIGS. 25, 26 and FIGS. 31, 32, the thick field oxide layer 22 is formed by oxidizing the substrate surface making use of the insulating layer 25 of silicon nitride film as the mask, as in the foregoing embodiment. For removing the parts of the insulating layer 25 corresponding to the peripheral circuits an etching is performed making use of a mask covering the area occupied by the memory cell mats 41, 42, 43, 44, whose pattern is shown in FIG. 19 in plan, so that the first polysilicon layer 24 may be exposed at its portions corresponding to the area on which the peripheral circuits are to be formed. Then, after removing the mask, the second polysilicon layer 26 is deposited over the entire area including the insulating layer 25 left on the memory cell mats, exposed portion 24' of the first polysilicon layer 24 and the field oxide layer 22.

It will be seen that the first polysilicon layer of the MOS transistors in the peripheral circuits can be connected to the second polysilicon layer, by simply adding a step of removing the other portion of the insulating layer 25 than that covering the memory cell mats.

Figure 27:
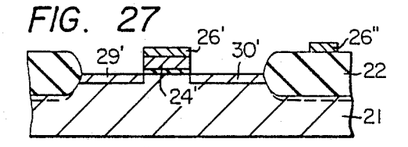
Figure 28:
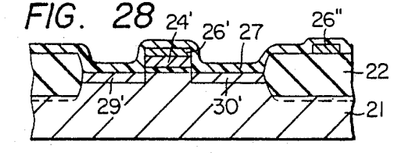
Figure 29:
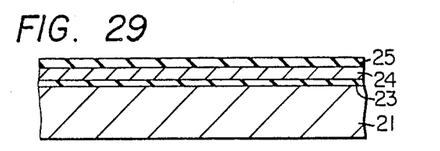
Figure 30:
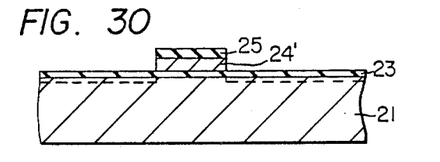
Figure 31:
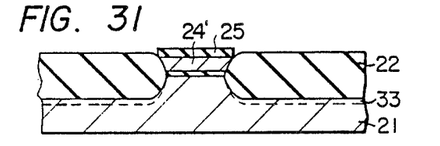
Figure 32:
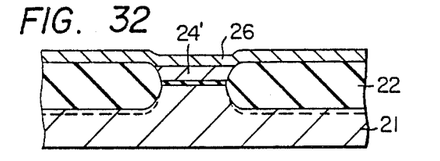
Figure 33:
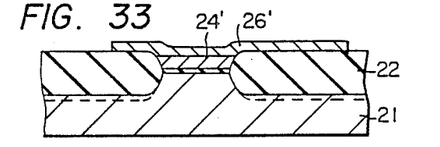
Figure 34:
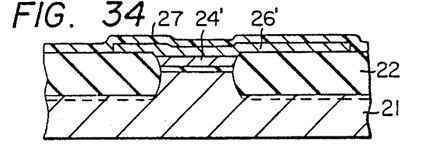

In addition, as will be seen from FIG. 27, the drain and the source regions 29' and 30' of the transistors of the peripheral circuits are formed, as is in the foregoing embodiment, in self-alignment with the second and the first polysilicon layers 26', 24'. Therefore, it is possible to form the transistors of the peripheral circuits simultaneously with the transistors of the memory cells.

It will be understood from the foregoing description that not only the area occupied by the memory cell mat, but the area occupied by the peripheral circuits as well can be remarkably diminished, according to the construction of transistor and the method of producing the same in accordance with the present invention.

Having described the invention through preferred embodiments, it is to be noted here that these embodiments are not exclusive, and various changes and modifications may be imparted thereto without departing from the scope of the invention.

What is claimed is:

1. A semiconductor device comprising a semiconductor body of a first conductivity type having a major surface; a source region and a drain region of a second conductivity type extending to the major surface of said substrate so as to define a channel portion at the major surface therebetween; a relatively thick field insulator formed at the major surface of said substrate except for the surfaces of said source and drain regions and channel portions; a first thin insulating film formed on said surface of said channel portion; a first floating gate formed on said first insulating film; a second thin insulating film formed on said first floating gate; a second control gate formed on said second insulating film and extending along its length on said field insulator; said first floating gate covering substantially only the surface of said channel so as not to extend on said field insulator so that said field insulator is self-aligned by said first floating gate; said second control gate, said second insulating film and said first floating gate having a width substantially the same as the length of said channel portion, and being self-aligned with one another with respect to their respective widths on the channel portion.

2. A semiconductor device according to claim 1, wherein said first gate and said second gate comprise polycrystalline silicon layers, and said second insulating film comprises a silicon nitride film.

3. A semiconductor device according to claim 2, wherein said second insulating film comprises a silicon nitride film sandwiched by two films of silicon oxide.

4. A semiconductor device according to claim 1, further comprising a semiconductor region having the same conductivity type as said substrate and a conductivity higher than said substrate formed in the surface of said substrate below said field insulator.

5. A semiconductor device according to claim 4, wherein said substrate and said first and second gates are made of silicon, said first insulating film and said field insulator are made of silicon oxide, and said second insulating film comprises a silicon nitride film.

6. An insulated gate type field effect semiconductor device comprising a silicon semiconductor substrate of a first conductivity type having a major surface; a pair of semiconductor regions of a second conductivity type extending on the major surface; an insulating film covering the major surface between said pair of semiconductor regions; and a multilayer gate structure formed on said insulating film over the major surface between said pair of semiconductor regions, comprising:
   a first floating gate electrode formed on said insulating film;
   a first silicon oxide film formed on said first floating gate electrode;
   a silicon nitride film formed on said first silicon oxide film;
   a second silicon oxide film formed on said silicon nitride film; and
   a second gate electrode formed on said second silicon oxide film.

7. A semiconductor device according to claim 6, wherein said insulating film consists essentially of silicon oxide and said first and second gate electrodes consist substantially of silicon.

8. An electrically programmable read only memory comprising a semiconductor body having a major surface; a plurality of drain regions and source regions formed in the major surface so as to define therebetween a plurality of channel portions on the major surface of said body in a form of a matrix; relatively thick field insulators formed at the major surface of said body except for the surfaces of said source and drain regions and channel portion; a plurality of first thin insulating films each formed on said surface of the corresponding channel portion; a plurality of first floating gates each formed on the corresponding first insulating film and self-aligned to said corresponding channel portion so as not to extend over said field insulators so that said field insulators are self-aligned by said first floating gates; a plurality of second insulating films each formed on and self-aligned to the corresponding first floating gate; a plurality of control gate lines each extending on said field insulators and the second insulating films in a form of a column and having a width substantially the same as the length of said channel portions and self-aligned thereto on the channel portion; a third insulating film covering the control gate lines, the field insulator, the source regions, and the drain regions; and a plurality of conductive lines each extending on said third insulating film on the drain and source regions and the second control gate lines, said conductive lines being in the form of a row and contacting to preselected ones of the drain regions through holes formed in the third insulating film above said preselected drain regions.

9. A read only memory according to claim 8, wherein said first insulating films and said field insulator consist essentially of silicon oxide, and said second insulating films consist essentially of silicon nitride.

10. A read only memory according to claim 8, wherein said field insulator and said first insulating films consist essentially of silicon oxide, said first floating gates and said second control gate lines consist essentially of silicon, and said second insulating film comprises a silicon nitride film sandwiched by silicon oxide films.

11. A read only memory according to claim 8, further comprising a plurality of semiconductor regions each having a conductivity type the same as the semiconductor body and a conductivity higher than that of the body in the surface of said body under said field insulator.

12. A semiconductor memory device comprising a semiconductor substrate of a first conductivity type; a source and a drain region of a second conductivity type opposite to said first conductivity type, formed in said substrate adjacent to the surface thereof, and spaced from each other; a first insulating gate film formed on the surface of said substrate between said source and drain regions; a first floating gate electrode formed on said first insulating gate film; a second insulating film formed on said first floating gate electrode; a second control gate electrode formed on said second insulating film; and, a field insulating film formed at the surface of said substrate so as to surround said source and drain regions, said first insulating gate film, said first floating gate electrode and said second insulating film, wherein the length and width of said first floating gate electrode are substantially equal to that of said first insulating film and said first floating gate electrode does not overlap said field insulating film so that said field insulator is self-aligned by said first floating gate.

13. A semiconductor memory device according to claim 12, wherein said first insulating film comprises a silicon oxide film, said first floating gate comprises a silicon layer, and said second insulating film comprises a silicon nitride film.

14. A semiconductor memory device according to claim 12, wherein said second insulating film comprises a silicon nitride film sandwiched by a first and a second silicon oxide film.

15. A semiconductor memory device according to claim 12, wherein said first and second gates comprise polycrystalline silicon layers.

16. A semiconductor memory device according to claim 12, further comprising a relatively heavily doped semiconductor region having the same conductivity type as said substrate formed in the surface of said substrate under said field insulating film.

17. A semiconductor memory device according to claim 12, wherein said second control gate electrode is extended between said source and drain regions.

18. A semiconductor memory device comprising:
a semiconductor body having a major surface;
first and second memory cell mats each having a plurality of memory cells formed and spaced from each other on a portion of said major surface wherein each of said memory cells comprises a source and a drain region formed in the major surface and spaced apart from one another, a first insulating gate film formed on the surface of said substrate between said source and drain regions; a first floating gate electrode formed on said first insulating gate film; a second insulating film formed on said first floating gate electrode; a second control gate electrode formed on said second insulating film; and, a field insulating film formed at the surface of said substrate so as to surround said source and drain regions, said first insulating gate film, said first floating gate electrode and said second insulating film, wherein the length and width of said first floating gate electrode are substantially equal to that of said first insulating film and said first floating gate electrode does not overlap said field insulating film so that said field insulator is self-aligned by said first floating gate; and
a decoder circuit formed on another portion of said major surface so as to be located between said first and second memory cell mats.

19. A semiconductor memory device according to claim 18, wherein each said memory cell comprises a first floating gate electrode and a second control gate electrode formed on said first floating gate electrode with an insulating film interposed between the first floating gate electrode and the second control gate electrode.

20. A semiconductor memory device comprising:
a semiconductor body having a major surface;
first and second memory cell mats each having a plurality of memory cells formed and spaced from each other on a portion of said major surface, wherein each of said memory cells comprises a source and a drain region formed in the major surface and spaced apart from one another, a first insulating gate film formed on the surface of said substrate between said source and drain regions; a first floating gate electrode formed on said first insulating gate film; a second insulating film formed on said first floating gate electrode; a second control gate electrode formed on said second insulating film; and, a field insulating film formed at the surface of said substrate so as to surround said source and drain regions, said first insulating gate film, said first floating gate electrode and said second insulating film, wherein the length and width of said first floating gate electrode are substantially equal to that of said first insulating film and said first floating gate electrode does not overlap said field insulating film so that said field insulator is self-aligned by said first floating gate; and
a sense-amplifier circuit formed on another portion of said major surface so as to be located between said first and second memory cell mats.

21. A semiconductor memory device according to claim 20, wherein each said memory cell comprises a first floating gate electrode and a second control gate electrode formed on said first floating gate electrode with an insulating film interposed between the first floating gate electrode and the second control gate electrode.

22. A semiconductor memory device according to claim 18, wherein said decoder circuit is constituted by insulated gate semiconductor elements.

23. A semiconductor memory device according to claim 18, wherein said decoder circuit constitutes a peripheral circuit for said memory cell mats, electrically connected to said memory cell mats.

24. A semiconductor memory device according to claim 20, wherein said sense-amplifier circuit is constituted by insulated gate semiconductor elements.

25. A semiconductor memory device according to claim 20, wherein said sense-amplifier circuit constitutes a peripheral circuit for said memory cell mats, electrically connected to said memory cell mats.

26. A semiconductor device according to claim 1, wherein said source region and said drain region are self-aligned with respect to said field insulator.

27. A semiconductor device according to claim 8, wherein said source and drain regions are self-aligned with respect to said relatively thick field insulators.

28. A semiconductor device according to claim 12, wherein the source and drain regions are self-aligned with respect to said field insulating film.

29. A semiconductor device according to claim 6, wherein said first floating gate electrode, first silicon oxide film, silicon nitride film, second silicon oxide film and second gate electrode are self-aligned with one another with respect to the width of the channel portion.

30. A semiconductor memory device according to claim 12, wherein said first floating gate electrode has a thickness of 0.1 to 0.4 microns.

31. A floating gate memory cell comprising:
a semiconductor substrate of one conductivity type, source and drain surface regions on said substrate of the opposite conductivity type and a channel region connecting said surface regions,
a conductive floating gate insulated from, overlying and substantially coextensive with said channel region in the direction transverse to the source-to-drain direction and insulated from said channel region,
a conductive control gate overlying and insulated from said floating gate and coextensive with said floating gate in the source-to-drain direction.

32. A memory cell as claimed in claim 31, said one conductivity type being p type.

33. A memory cell as claimed in claim 31, said floating gate being heavily doped polycrystalline silicon.

34. A memory cell as claimed in claim 31, the floating gate being insulated from said channel by silicon oxide.

35. A memory cell as claimed in claim 31, said control gate being insulated from said floating gate by insulation comprising silicon nitride.

36. A memory cell as claimed in claim 31, said control gate being insulated from said floating gate by insulation comprising silicon oxide.

37. A memory cell as claimed in claim 31, said floating gate being self-aligned to said channel region in the source-to-drain direction.

38. A memory cell as claimed in claim 37, the floating gate being insulated from said channel by silicon oxide.

39. A memory cell as claimed in claim 38, the control gate being insulated from said floating gate by silicon oxide.

40. A memory cell as claimed in claim 38, the control gate being insulted from said floating gate by silicon nitride.

* * * * *